(12) United States Patent
Kwag

(10) Patent No.: US 11,195,871 B2
(45) Date of Patent: Dec. 7, 2021

(54) IMAGE SENSING DEVICE

(71) Applicant: SK hynix Inc., Icheon-si (KR)

(72) Inventor: Pyong Su Kwag, Eumseong-gun (KR)

(73) Assignee: SK hynix Inc., Icheon-si (KR)

( * ) Notice: Subject to any disclaimer, the term of this patent is extended or adjusted under 35 U.S.C. 154(b) by 159 days.

(21) Appl. No.: 16/598,836

(22) Filed: Oct. 10, 2019

(65) Prior Publication Data
US 2021/0020681 A1 Jan. 21, 2021

(30) Foreign Application Priority Data

Jul. 19, 2019 (KR) ........................ 10-2019-0087323

(51) Int. Cl.
*H01L 27/146* (2006.01)
*H04N 5/378* (2011.01)

(52) U.S. Cl.
CPC .. *H01L 27/14641* (2013.01); *H01L 27/14605* (2013.01); *H01L 27/14612* (2013.01); *H01L 27/14643* (2013.01); *H04N 5/378* (2013.01)

(58) Field of Classification Search
CPC ........ H01L 27/14643; H01L 27/14612; H01L 27/14605; H01L 27/14609; H01L 27/14641; H04N 5/3745; H04N 5/37457; H04N 5/378
See application file for complete search history.

(56) References Cited

U.S. PATENT DOCUMENTS

| | | | | |
|---|---|---|---|---|
| 9,160,955 B2 * | 10/2015 | Kudoh | ............ | H01L 27/14614 |
| 2019/0115379 A1 | 4/2019 | Kato et al. | | |
| 2020/0135779 A1 * | 4/2020 | Takahashi | ......... | H01L 27/14627 |
| 2020/0244910 A1 * | 7/2020 | Ma | ........................ | H04N 5/378 |

FOREIGN PATENT DOCUMENTS

KR    10-2018-0076054        7/2018

* cited by examiner

*Primary Examiner* — Jose R Diaz
(74) *Attorney, Agent, or Firm* — Perkins Coie LLP

(57) ABSTRACT

An image sensing device is provided to include a pixel array including unit pixel blocks. Each of the unit pixel blocks includes a first subpixel block including a first floating diffusion (FD) region and unit pixels surrounding the first FD region, a second subpixel block including a second FD region electrically coupled to the first FD region and unit pixels surrounding the second FD region. The image sensing device also includes a first pixel transistor array and a second pixel transistor array that are disposed at opposite sides of the first subpixel block in the first direction. The first and the pixel transistor array include a first drive transistor set and a second drive transistor set, respectively.

16 Claims, 6 Drawing Sheets

IMAGE SENSING DEVICE

CROSS-REFERENCE TO RELATED APPLICATION

This patent document claims the priority and benefits of Korean patent application No. 10-2019-0087323, filed on Jul. 19, 2019, which is hereby incorporated in its entirety by reference.

TECHNICAL FIELD

The technology and implementations disclosed in this patent document relate to an image sensing device.

BACKGROUND

An image sensing device is a semiconductor device for converting an optical image into electrical signals. In recent times, with the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

SUMMARY

Various embodiments of the disclosed technology relate to an image sensing device which, among other features and benefits, can improve an 8-shared pixel structure, thereby increasing a gain of a source follower and a transfer rate of one or more pixel signals.

In accordance with an embodiment of the disclosed technology, an image sensing device may include a pixel array including unit pixel blocks that are arranged in columns and rows. Each of the unit pixel blocks includes a first subpixel block including a first floating diffusion (FD) region and unit pixels surrounding the first floating diffusion (FD) region, a second subpixel block including a second floating diffusion (FD) region electrically coupled to the first floating diffusion (FD) region and unit pixels surrounding the second floating diffusion (FD) region, and a first pixel transistor array and a second pixel transistor array that are disposed at opposite sides of the first subpixel block in the first direction. The second subpixel block is spaced apart from the first subpixel block by a predetermined distance in a first direction. The first pixel transistor array includes a first drive transistor set in which a first source follower transistor and a first selection transistor are coupled in series. The second pixel transistor array includes a second drive transistor set in which a second source follower transistor and a second selection transistor are coupled in series. The first drive transistor set and the second drive transistor set are coupled in parallel.

In accordance with another embodiment of the disclosed technology, an image sensing device may include a pixel array including unit pixel blocks that are arranged in column and rows. Each of the unit pixel blocks includes a first subpixel block including a first floating diffusion (FD) region and unit pixels sharing the first floating diffusion (FD) region, a second subpixel block including a second floating diffusion (FD) region electrically coupled to the first floating diffusion (FD) region and unit pixels sharing the second floating diffusion (FD) region, and a first source follower transistor and a second source follower transistor that are located at opposite sides of the first subpixel block in the first direction. The second subpixel block is spaced apart from the first subpixel block by a predetermined distance in a first direction. The first source follower transistor and the second source follower transistor are arranged along a first diagonal direction.

In accordance with still another embodiment of the disclosed technology, an image sensing device may include a pixel array including unit pixel blocks that are arranged in columns and rows. Each of the unit pixel blocks includes a first subpixel block configured to include a first floating diffusion (FD) region and unit pixels sharing the first floating diffusion (FD) region, a second subpixel block configured to include a second floating diffusion (FD) region electrically coupled to the first floating diffusion (FD) region and unit pixels sharing the second floating diffusion (FD) region, and a first pixel transistor array and a second pixel transistor array that are disposed at opposite sides of the first subpixel block in the first direction. The second subpixel block is spaced apart from the first subpixel block by a predetermined distance in a first direction. The first pixel transistor array includes a first drive transistor set including a first source follower transistor and a first selection transistor. The second pixel transistor array includes a second drive transistor set including a second source follower transistor and a second selection transistor. The first drive transistor set and the second drive transistor set are located symmetrical to each other with respect to the first subpixel block.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
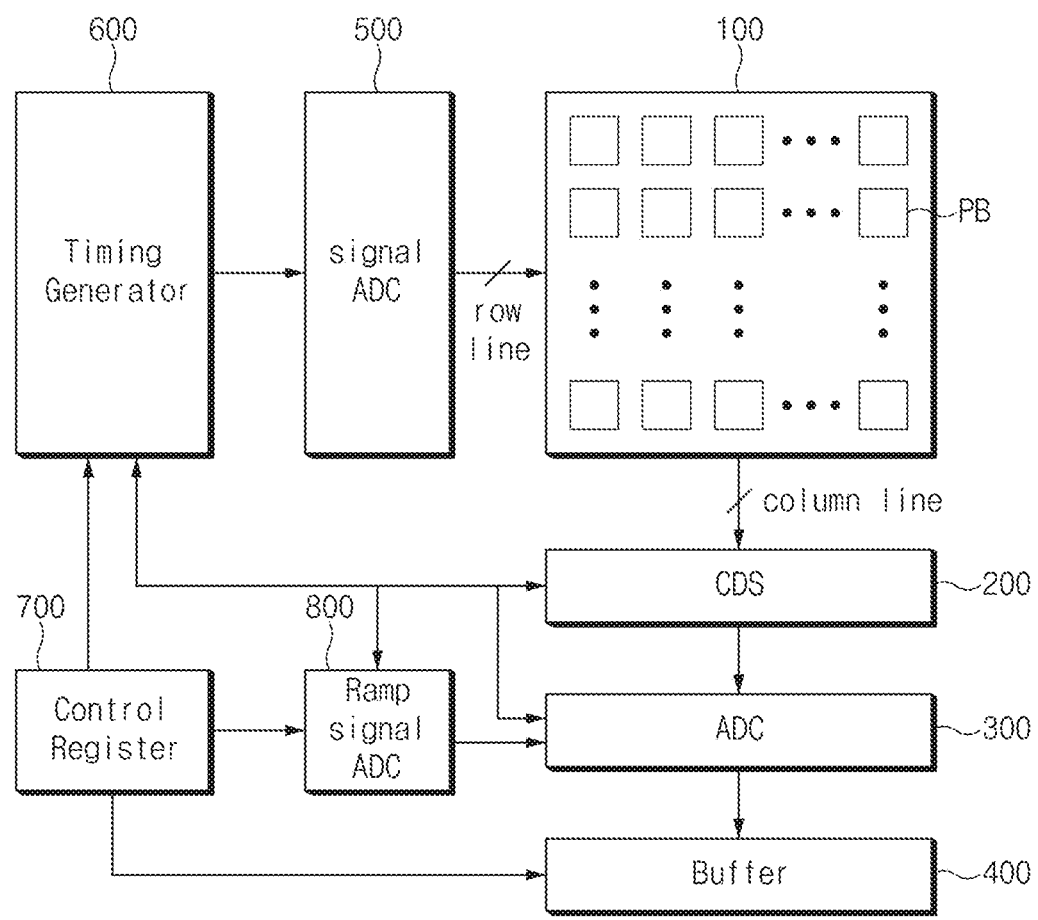
FIG. 1 is an example of a block diagram illustrating an image sensor based on some implementations of the disclosed technology.

FIG. 1 is an example of a block diagram illustrating an image sensor 100 based on some implementations of the disclosed technology.

Referring to FIG. 1, the image sensor 100 may include a pixel array 100, a correlated double sampler (CDS) circuit 200, an analog-to-digital converter (ADC) circuit 300, a buffer 400, a row driver 500, a timing generator 600, a control register 700, and a ramp signal generator 800.

The pixel array 100 may include a plurality of unit pixel blocks (PBs) arranged in a matrix shape including columns and rows. Each unit pixel block (PB) may include a plurality of unit pixels and some of the unit pixels may be configured to share a floating diffusion (FD) region and pixel transistors with each other. For example, the unit pixel block (PB) may be formed as an 8-shared pixel structure in which some of the 8 unit pixels share a floating diffusion (FD) region, a reset transistor, a source follower transistor, and a selection transistor with one another. Four unit pixels among the 8 unit pixels may be configured to share a floating diffusion (FD) region, and the remaining four unit pixels may share another floating diffusion (FD) region. Each unit pixel includes a photoelectric conversion element for generating photocharges through conversion of an incident optical signal received from the outside. The photosensing element may include, for example, a photodiode, a photogate, a phototransistor, a photoconductor, or some other photosensing structures capable of generating photocharges.

Each unit pixel includes a transmission (Tx) transistor for transmitting photocharges generated from the photoelectric conversion element to the floating diffusion (FD) region. For example, each pixel block (PB) may be configured in a manner that two pairs of the source follower transistors and selection transistors are coupled in parallel to each other so as to drive a single output node, as will be further explained later of this patent document. Each unit pixel block (PB) may output a pixel signal indicating electrical image signals of each unit pixel to the CDS circuit 200 through column lines. In some implementations, output nodes of the unit pixel blocks (PBs) may be coupled to column lines. The unit pixel blocks (PBs) may be coupled to row lines and column lines.

The correlated double sampler (CDS) circuit 200 may hold and sample the pixel signals received from the unit pixel blocks (PBs) of the pixel array 100. For example, the correlated double sampler (CDS) circuit 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) circuit 300.

The analog-to-digital converter (ADC) circuit 300 may compare a ramp signal received from the ramp signal generator 800 with a sampling signal received from the correlated double sampler (CDS) circuit 200, and may thus output a comparison signal indicating the result of comparison between the ramp signal and the sampling signal. The analog-to-digital converter (ADC) circuit 300 may count a level transition time of the comparison signal in response to a clock signal received from the timing generator 600, and may output a count value indicating the level transition time to the buffer 400.

The buffer 400 may store each of the digital signals received from the analog-to-digital converter (ADC) circuit 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may drive pixel blocks of the pixel array 100 in response to an output signal of the timing generator 600. For example, the row driver 500 may generate a control signal capable of selecting at least one of the plurality of row lines. The control signal may include a selection signal for controlling the selection transistor and a transmission (Tx) signal for controlling multiple transfer gates to be described later.

The timing generator 600 may generate a timing signal to control the row driver 500, the correlated double sampler (CDS) circuit 200, the analog-to-digital converter (ADC) circuit 300, and the ramp signal generator 800.

The control register 700 may generate control signals to control the ramp signal generator 800, the timing generator 600, and the buffer 400.

The ramp signal generator 800 may generate a ramp signal to control an image signal received from the buffer 400 in response to a control signal received from the timing generator 600.

Figure 2:
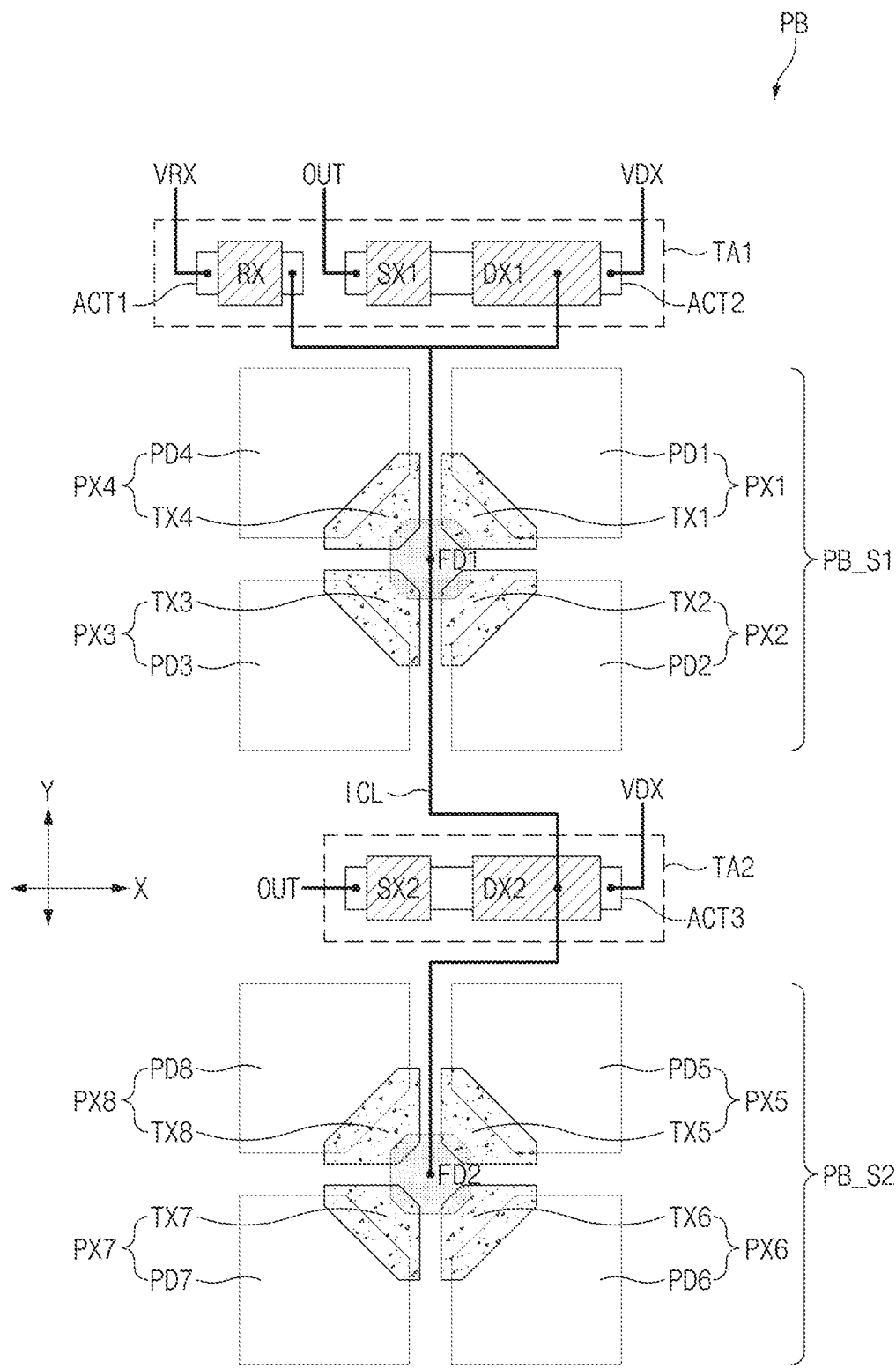
FIG. 2 is an example of a layout diagram illustrating a unit pixel block having an 8-shared pixel structure based on some implementations of the disclosed technology.
Figure 3:
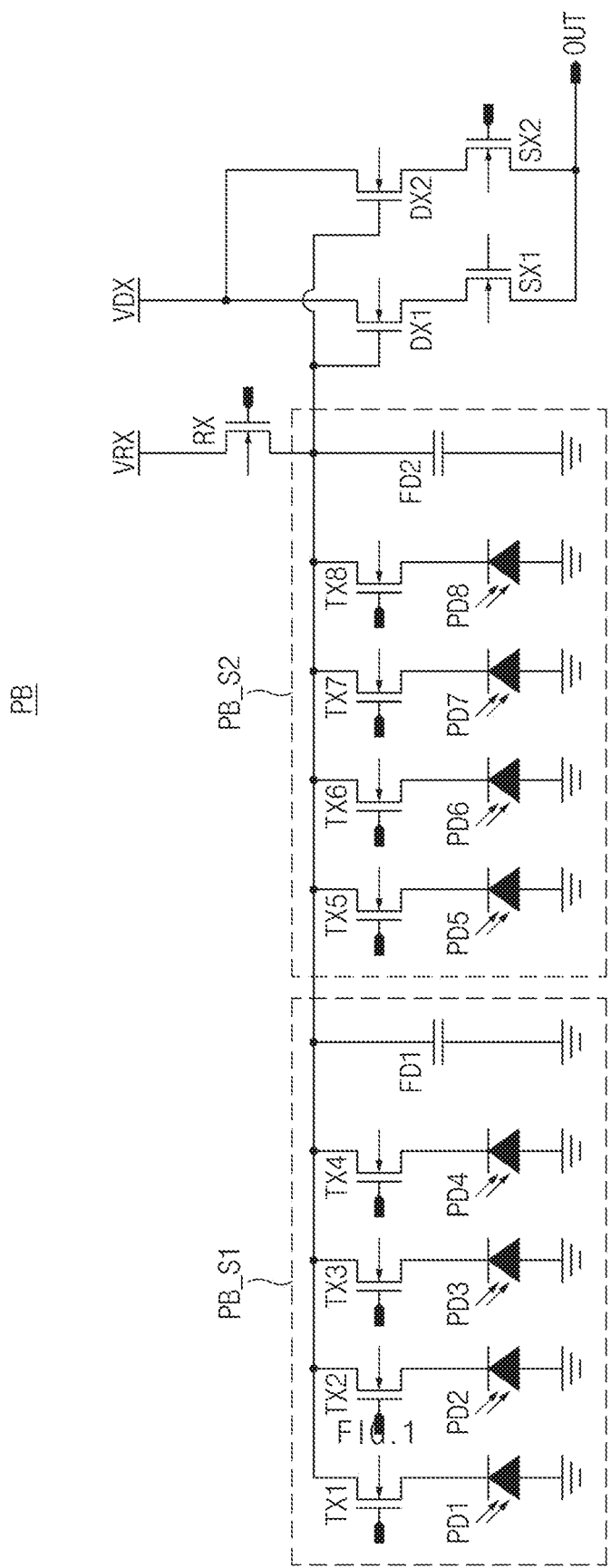
FIG. 3 is an example of an equivalent circuit diagram illustrating a unit pixel block shown in FIG. 2.

FIG. 2 is an example of a layout diagram a unit pixel block having an 8-shared pixel structure based on some implementations of the disclosed technology. FIG. 3 is an equivalent circuit diagram illustrating the unit pixel block shown in FIG. 2.

Referring to FIGS. 2 and 3, each unit pixel block PB may include 8 unit pixels PX1 to PX8, two floating diffusion (FD) regions FD1 and FD2, two source follower transistors DX1 and DX2, two selection transistors SX1 and SX2, and a single reset transistor RX.

Each of the unit pixels PX1 to PX8 may include a single photoelectric conversion element (e.g., one of PD1 to PD8) for generating photocharges in response to incident light, and a single transmission transistor (e.g., one of TX1 to TX8) for transmitting the photocharges generated from each of the photoelectric conversion elements PD1 to PD8 to the floating diffusion (FD) regions FD1 and FD2.

Each of the photoelectric conversion elements PD1 to PD8 may include an organic or inorganic photodiode. For example, the photoelectric conversion elements PD1~PD8 may be formed in a lower region (or a lower portion) of the substrate, and may include a stacked structure in which impurity regions (e.g., P-type impurity region and N-type impurity region) having complementary conductivities are vertically stacked.

Each of the floating diffusion (FD) regions FD1 and FD2 may be formed in an upper region of the substrate, and may temporarily store photocharges received through the transmission transistors TX1 to TX8. The floating diffusion (FD) regions FD1 and FD2 may be coupled to each other through interconnection lines (ICLs). In some implementations, two floating diffusion (FD) regions FD1 and FD2 are commonly coupled to each other so that the two floating diffusion (FD) regions FD1 and FD2 can be shared by the 8 unit pixels PX1 to PX8. In addition, the floating diffusion (FD) regions FD1 and FD2 may be coupled to gates of the source follower transistors DX1 and DX2 and a source/drain region of the reset transistor RX through metal lines (ML).

The transmission (Tx) transistors TX1 to TX8 may be coupled among the photoelectric conversion elements PD1 to PD8 and the floating diffusion (FD) regions FD1 and FD2. In some implementations, one end of each of the transmission (Tx) transistors TX1 to TX8 may be coupled to the photoelectric conversion elements PD1 to PD8, and the other end of each of the transmission (Tx) transistors TX1 to TX8 may be coupled to the floating diffusion (FD) regions FD1 and FD2. The transmission (Tx) transistors TX1 to TX8 may transmit photocharges generated by the photoelectric conversion elements PD1 to PD8 to the floating diffusion (FD) regions FD1 and FD2 in response to transmission (Tx) signals applied to the transfer gates.

The 8 unit pixels PX1 to PX8 included in the unit pixel block (PB) may be designed in a manner that four unit pixels from among the 8 unit pixels PX1 to PX8 share a single floating diffusion (FD) region and the remaining four unit pixels share another single floating diffusion (FD) region. For example, the four unit pixels PX1 to PX4 may be arranged to surround the floating diffusion (FD) region FD1 and share the floating diffusion (FD) region FD1. The remaining four unit pixels PX5 to PX8 may be arranged to surround the floating diffusion (FD) region FD2 and share the floating diffusion (FD) region FD2.

The unit pixel block (PB) may include a first subpixel block PB_S1 and a second subpixel block PB_S2. The first subpixel block PB_S1 may include four unit pixels PX1 to PX4 sharing the floating diffusion (FD) region FD1 and the floating diffusion (FD) region FD1, and the second subpixel block PB_S2 may include four unit pixels PX5 to PX8 sharing the floating diffusion (FD) region FD2 and the floating diffusion (FD) region FD2.

In the unit pixel block PB, the first subpixel block PB_S1 and the second subpixel block PB_S2 may be spaced apart from each other by a predetermined distance in a Y-axis direction. In some implementations, the first subpixel block PB_S1 may be identical in structure and size to the second subpixel block PB_2.

A pixel transistor array TA1 may be formed in one side of the first subpixel block PB_S1, and a pixel transistor array TA2 may be formed in an opposite side of the first subpixel block PB_S1. The pixel transistor array TA1, the first subpixel block PB_S1, and the pixel transistor array TA2 may be arranged in the Y-axis direction. For example, the pixel transistor array TA2 may be disposed between the subpixel blocks PB_S1 and PB_S2.

The pixel transistor array TA1 may include a reset transistor RX1, a selection transistor SX1, and a source follower transistor DX1 that are arranged in an X-axis direction perpendicular to the Y-axis direction. In some implementations, the transistors RX1, SX1, and DX1 may be arranged in the order of the reset transistor RX1 the selection transistor SX1 the source follower transistor DX1 in the direction from the left side to the right side.

The pixel transistor array TA2 may include a selection transistor SX2 and a source follower transistor DX2 that are arranged in the X-axis direction. In some implementations, the transistors SX2 and DX2 may be arranged in the order of the selection transistor SX2 the source follower transistor DX2 in the direction from the left side to the right side.

In the pixel transistor array TA1, the reset transistor RX may be formed in the active region ACT1. The reset transistor RX may be coupled between a reset voltage node VRX and another node connected to the floating diffusion (FD) regions FD1 and FD2. For example, in the active region ACT1, a source/drain region located at one side of the reset gate may be coupled to the reset voltage node VRX, and a source/drain region located at the other side of the reset gate may be coupled to the floating diffusion (FD) regions FD1 and FD2.

In the pixel transistor array TA1, the selection transistor SX1 and the source follower transistor DX1 may be coupled in series between the drive voltage node VDX and the output node OUT. For example, the selection transistor SX1 and the source follower transistor DX1 may share the source/drain region which is disposed in the single active region ACT2 and between a gate of the selection transistor SX1 and a gate of the source follower transistor DX1. The selection transistor SX1 and the source follower transistor DX1 may be formed in the single active region ACT2 that is formed to extend in the X-axis direction. In the selection transistor SX1, the source/drain region located opposite to the shared source/drain region may be coupled to the output node OUT. In the source follower transistor DX1, the source/drain region located opposite to the shared source/drain region may be coupled to the drive voltage node VDX.

In the pixel transistor array TA2, the source follower transistor DX2 and the selection transistor SX2 may be coupled in series between the drive voltage node VDX and the output node OUT. For example, the selection transistor SX2 and the source follower transistor DX2 may share the source/drain region which is disposed between a gate of the selection transistor SX2 and a gate of the source follower transistor DX2 in the single active region ACT3 formed to extend in the X-axis direction. In the selection transistor SX2, the source/drain region located opposite to the shared source/drain region may be coupled to the output node OUT. In the source follower transistor DX2, the source/drain region located opposite to the shared source/drain region may be coupled to the drive voltage node VDX.

In some implementations, the arrangement of the selection transistor SX2 and the source follower transistor DX2 may be symmetrical to the arrangement of the selection transistor SX1 and the source follower transistor DX1, with respect to the subpixel block PB_S1. In some implementations, the shape and size of the selection transistor SX2 and the source follower transistor DX2 in the pixel transistor array TA2 may be identical to those of the selection transistor SX1 and the source follower transistor DX2 in the pixel transistor array TA1. For example, the source follower transistors DX1 and DX2 may have the same size (e.g., the same channel width), and the selection transistors SX1 and SX2 may have the same size (e.g., the same channel width).

Gates of the source follower transistors DX1 and DX2 may be coupled to the floating diffusion (FD) regions FD1 and FD2 through metal lines.

As described above, the unit pixel block PB may be designed in a manner that a serial connection of the source follower transistor DX1 and the selection transistor SX1 is coupled in parallel to a serial connection of the source follower transistor SX2 and the selection transistor SX2. Each of the serial connections, i.e., the serial connection of the source follower transistor DX1 and the selection transistor SX1 and the serial connection of the source follower transistor SX2 and the selection transistor SX2, is disposed between the drive voltage node VDX and the output node OUT. The source follower transistors DX1 and DX2 coupled in parallel to each other may operate as a single output source follower transistor having a relatively large channel width, and the selection transistors SX1 and SX2 coupled in parallel to each other may operate as a single output selection transistor having a relatively large channel width. In this case, since two source follower transistors DX1 and DX2 operate together, the channel width of the output source follower transistor can increase. Similarly, since two selection transistors SX1 and SX2 operate together, the channel width of the output selection transistor can increase.

Thus, the unit pixel block (PB) may drive the single output node OUT using the two source follower transistors DX1 and DX2 coupled in parallel and the two selection transistors SX1 and SX2 coupled in parallel, so that the unit pixel block PB may output a pixel signal to a single column line coupled to the output node OUT.

As described above, since the channel widths of the source follower transistor and the selection transistor contained in the unit pixel block PB are relatively enlarged, the source follower gain can be improved. In addition, since resistance of each of the selection transistors is reduced, a transfer rate of the pixel signal can be increased.

Although FIG. 2 illustrates that the pixel transistor arrays TA1 and TA2 are disposed at both sides of the subpixel block PB_S1 for convenience of description, other implementations are possible. In some other implementations, the pixel transistor arrays TA1 and TA2 may be disposed at both sides of the subpixel block PB_S2. For example, the pixel transistor array TA1 may also be formed below the subpixel block PB_S2.

Figure 4:
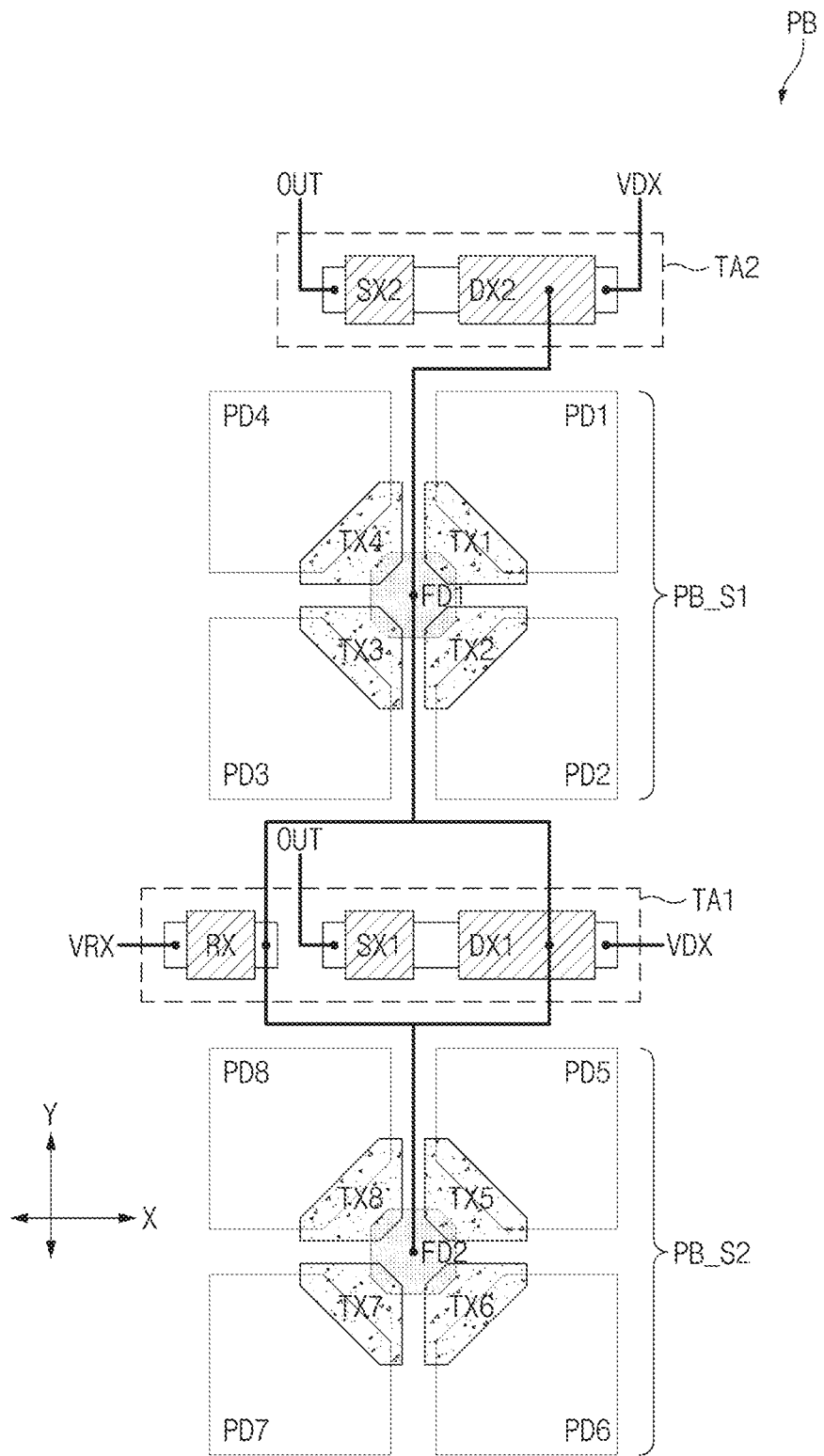
FIG. 4 is another example of a layout diagram illustrating a unit pixel block having an 8-shared pixel structure based on some implementations of the disclosed technology.

FIG. 4 shows another example of a layout diagram of a unit pixel block having an 8-shared pixel structure based on some implementations of the disclosed technology.

The unit pixel block PB shown in FIG. 4 is different from the unit pixel block PB shown in FIG. 2 in positions of the pixel transistor arrays TA1 and TA2.

For example, in the unit pixel block PB shown in FIG. 4, the pixel transistor array TA2 may be formed in one side of the first subpixel block PB_S1, and the pixel transistor array TA1 may be formed in an opposite side of the first subpixel block PB_S1. The pixel transistor array TA2, the first subpixel block PB_S1, and the pixel transistor array TA1 may be sequentially arranged in the Y-axis direction. For example, the pixel transistor array TA1 may be disposed between the subpixel blocks PB_S1 and PB_S2.

Except the locations of the pixel transistor arrays TA1 and TA2, the constituent elements of the unit pixel block PB shown in FIG. 4 may be identical to those of the unit pixel block PB shown in FIG. 2. A detailed description thereof will herein be omitted for concise description.

Figure 5:
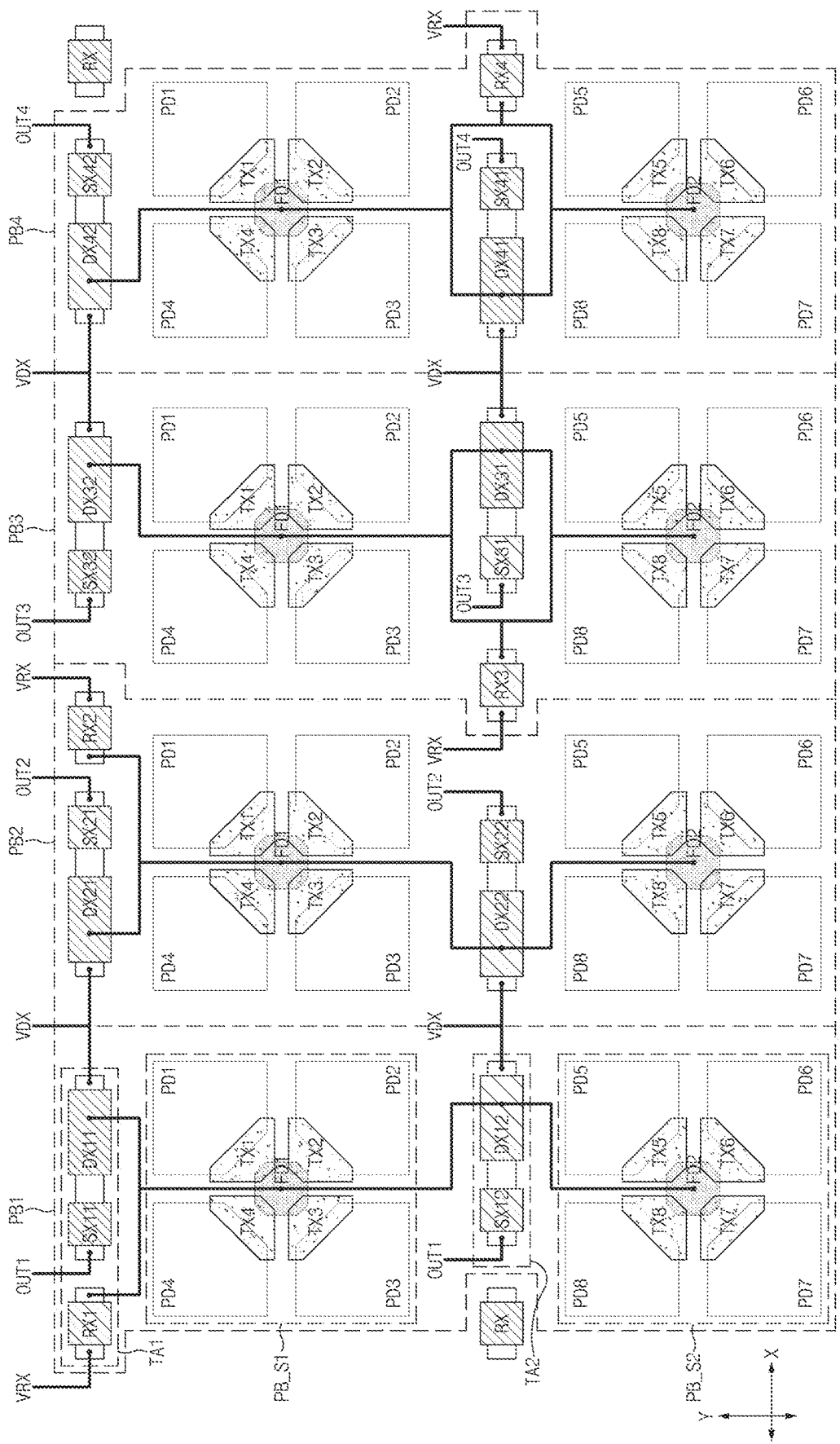
FIG. 5 is an example of a schematic diagram illustrating four unit pixel blocks, each of which includes an 8-shared pixel structure arranged based on some implementations of the disclosed technology.

FIG. 5 is a schematic diagram illustrating four unit pixel blocks, each of which includes the 8-shared pixel structure, arranged based on some implementations of the disclosed technology.

Referring to FIG. 5, the pixel array 100 may include four unit pixel blocks PB1 to PB4 that are arranged in the X-axis direction. The pixel array 100 may include a plurality of four unit pixel blocks arranged in the X-axis and Y-axis directions. For convenience of description, the four unit pixel blocks PB1 to PB4 shown in FIG. 5 will hereinafter be referred to as a unit pixel block group.

The unit pixel blocks PB1 to PB4 may include 8 unit pixels, two floating diffusion (FD) regions FD1 and FD2, two source follower transistors DX11 to DX42, two selection transistors SX11 to SX42, and a single reset transistor (RX1 to RX4). Each unit pixel may include a single photoelectric conversion element PD1 to PD8 and a single transmission (Tx) transistor TX1 to TX8).

In each of the unit pixel blocks PB1 to PB4, the floating diffusion (FD) regions FD1 and FD2 may be shared by four unit pixels surrounding the floating diffusion (FD) regions FD1 and FD2, and the floating diffusion (FD) regions FD1 and FD2 may be coupled to each other. In some implementations, each of the unit pixel blocks PB1 to PB4 may include two subpixel blocks (e.g., PB_S1 and PB_S2 depicted in FIG. 2), each of which includes four unit pixels and a single floating diffusion (FD) region shared by the four unit pixels. The floating diffusion (FD) regions FD1 and FD2 may be coupled to gates of the source follower transistors DX11 to DX42 and the source/drain regions of the reset transistors RX1 to RX4 through metal lines.

In each of the unit pixel blocks PB1 to PB4, the subpixel blocks PB_S1 and PB_S2 may be spaced apart from each other by a predetermined distance in the Y-axis direction.

In each of the unit pixel blocks PB1 to PB4, two source follower transistors, two selection transistors, and a single reset transistor may be disposed in one of sides of the subpixel block PB_S1 in the Y-axis direction. For example, the pixel transistor arrays may be respectively formed in both sides of the subpixel block PB_S1 in the Y-axis direction. Thus, each of the unit pixel blocks PB1 to PB4 may include two pixel transistor arrays TA1 and TA2 that are disposed in both sides of the subpixel block PB_S1, respectively.

The pixel transistor arrays TA1 in each unit pixel block PB1 to PB4 may include a reset transistor, a selection transistor and a source follower transistor that are arranged in the X-axis direction. For example, the reset transistor RX1, the selection transistor SX11, and the source follower transistor DX11 may be arranged in the X-axis direction at one side, e.g., the top side, of the subpixel block PB_S1.

The pixel transistor arrays TA2 in each unit pixel block PB1 to PB4 may include a selection transistor and a source follower transistor that are arranged in the X-axis direction. For example, the selection transistor SX12 and the source follower transistor DX12 may be arranged in the X-axis direction at another side, e.g., the bottom side, of the subpixel block PB_S1.

In the following description, the pixel transistor array including the reset transistors RX1 to RX4 will be referred to as a first pixel transistor array, and the pixel transistor array not including the reset transistors RX1 to RX4 will be referred to as a second pixel transistor array.

In the first pixel transistor array, the reset transistors RX1 to RX4 may be coupled between the reset voltage node VRX and another node connected to the floating diffusion (FD) regions FD1 and FD2. For example, each of the reset transistors RX1 to RX4 may be formed in a single active region separately from the selection transistor SX11 to SX42 and the source follower transistor DX11 to DX42. In the corresponding active region, the source/drain region located at one side of the reset gate may be coupled to the reset voltage node VRX, and the source/drain region located at the other side of the reset gate may be coupled to the floating diffusion (FD) regions FD1 and FD2 of the corresponding unit blocks PB1 to PB4.

In the first pixel transistor array and the second pixel transistor array, the selection transistors SX11 to SX42 and the source follower transistors DX11 to DX42 may be coupled in series between the drive voltage node VDX and the output nodes OUT1 to OUT4. For example, each selection transistor and each source follower transistor may share the source/drain region which is disposed in the single active region and between a gate of the selection transistor and a gate of the source follower transistor. The selection transistor and the source follower transistor are formed in the single active region that is formed to extend in the X-axis direction. The source/drain regions of the selection transistors SX11 to SX42, which are located opposite to the shared source/drain regions, may be coupled to the output nodes OUT1 to OUT4. The source/drain regions of the source follower transistors DX11 to DX42, which are located opposite to the shared source/drain regions, may be coupled to the drive voltage node VDX.

Each of the unit pixel blocks PB1 to PB4 includes two drive transistor sets and each drive transistor set includes one source follower transistor and one selection transistor that are coupled in series to each other. The two drive transistor sets may be coupled in parallel to each other between the drive voltage node VDX and the output node OUT1 to OUT4.

In some implementations, in each of the unit pixel blocks PB1~PB4, two drive transistor sets may be identical in structure and size to each other, and may be disposed at both sides of the subpixel block PB_S1 or PB_S2. In the example of FIG. 5, the two drive transistor sets are disposed at both sides of the subpixel block PB_S1 to be symmetrical with respect to the subpixel block PB_S1.

In each of the unit pixel blocks PB1 to PB4, the length of the first pixel transistor array may be longer than the length of each of the subpixel blocks PB_S1 and PB_S2. For example, the first pixel transistor array may protrude more than each of the subpixel blocks PB_S1 and PB_S2 in the X-axis direction. Thus, the length of the first pixel transistor array may be measured along the X-direction. For example, the reset transistor included in the first pixel transistor array may be located to protrude from the edge of each of the subpixel blocks PB_S1 and PB_S2. In each of the unit pixel blocks PB1 to PB4, the length of the second pixel transistor array may be shorter than the length of each of the subpixel blocks PB_S1 and PB_S2.

Hereinafter, a difference in structure between the unit pixel blocks PB1 to PB4 included in the unit pixel block group will be described with reference to the attached drawings.

Referring to FIG. 5, in the unit pixel block PB1, the first pixel transistor array may be disposed at one side, e.g., the upper side, of the subpixel block PB_S1 in the Y-axis direction, and the second pixel transistor array may be disposed at the other side, e.g., the lower side, of the subpixel block PB_S1 in the Y-axis direction. Thus, the second pixel transistor array may be disposed between the subpixel blocks PB_S1 and PB_S2 so as to be opposite to the first pixel transistor array.

Similarly, in the unit pixel block PB2 located adjacent to the unit pixel block PB1, the first pixel transistor array may be disposed at one side, e.g., the upper side, of the subpixel block PB_S1 in the Y-axis direction, and the second pixel transistor array may be disposed at the other side, e.g., the lower side, of the subpixel block PB_S1. Thus, the second pixel transistor array may be disposed between the subpixel blocks PB_S1 and PB_S2 to be opposite to the first pixel transistor array.

The first pixel transistor array of first unit pixel block PB1 and the first pixel transistor array of the unit pixel block PB2 may be arranged symmetrical to each other with respect to a boundary line between the unit pixel blocks PB1 and PB2. Thus, the first pixel transistor array of the unit pixel block PB1 include transistors as identical as to those included in the first pixel transistor array of the unit pixel block PB2 in terms of the size. However, the arrangement order of the constituent elements of the first pixel transistor array of the unit pixel block PB1 is different from the arrangement order of the constituent elements of the first pixel transistor array of the unit pixel block PB2. For example, along the X-direction from the left to the right, the reset transistor RX1, the selection transistor SX11, and the source follower transistor DX11 are arranged in turn in the unit pixel block PB1.

Unlike in the unit pixel block PB1, along the X-direction from the left to the right, the source follower transistor DX21, the selection transistor SX21, and the reset transistor RX2 are arranged in turn in the unit pixel block PB2. The above-mentioned arrangement structure of the first pixel transistor arrays of the unit pixel blocks PB1 and PB2 may be referred to as a flip-shaped arrangement structure. In this case, the source follower transistor DX11 of the first pixel transistor array of the unit pixel block PB1 may be located adjacent to the source follower transistor DX21 of the first pixel transistor array of the unit pixel block PB2 and the source follower transistors DX11 and DX21 may share the same drive voltage node VDX.

Likewise, the second pixel transistor array of the unit pixel block PB1 and the second pixel transistor array of the unit pixel block PB2 may be formed in a flip-shaped structure and arranged symmetrical to each other with respect to the boundary line between the unit pixel blocks PB1 and PB2. The source follower transistor DX12 of the second pixel transistor array of the unit pixel block PB1 may be located adjacent to the source follower transistor DX22 of the second pixel transistor array of the unit pixel block PB2 and the source follower transistors DX12 and DX22 may share the drive voltage node VDX.

In the unit pixel block PB3 located adjacent to the unit pixel block PB2, the second pixel transistor array may be disposed at one side, e.g., the upper side, of the subpixel block PB_S1 in the Y-axis direction, and the first pixel transistor array may be disposed at the other side, e.g., the lower side, of the subpixel block PB_S1 in the Y-axis direction. Thus, the first pixel transistor array may be disposed between the subpixel blocks PB_S1 and PB_S2 to be opposite to the second pixel transistor array.

In some implementations, the first pixel transistor array of the unit pixel block PB2 and the second pixel transistor array of the unit pixel block PB3 may be arranged in the X-axis direction, and the second pixel transistor array of the unit pixel block PB2 and the first pixel transistor array of the unit pixel block PB3 may be arranged in the X-axis direction. Therefore, around the boundary region between the unit pixel blocks PB2 and PB3, a protrusion part of the first pixel transistor array of the unit pixel block PB2, in which the reset transistor RX2 is located, may be located adjacent to the second pixel transistor array of the unit pixel block PB3. Since the second pixel transistor array of the unit pixel block PB3 does not include the reset transistor, the second pixel transistor array has a shape recessed from the boundary region between the unit pixel blocks PB2 and PB3. The protrusion part of the first pixel transistor array of the unit pixel block PB2 can be located in the recessed part of the second pixel transistor array of the unit pixel block PB3.

In the unit pixel block PB3, transistors contained in the first pixel transistor array may be arranged in the same order as transistors contained in the first pixel transistor array of the unit pixel block PB1, and transistors contained in the second pixel transistor array may be arranged in the same order as transistors contained in the second pixel transistor array of the unit pixel block PB1.

In the unit pixel block PB4 located adjacent to the unit pixel block PB3, the second pixel transistor array may be disposed at one side, e.g., the upper part, of the subpixel block PB_S1 in the Y-axis direction, and the first pixel transistor array may be disposed at the other side, e.g., the lower part, of the subpixel block PB_S1 in the Y-axis direction. Thus, the first pixel transistor array may be disposed between the subpixel blocks PB_S1 and PB_S2 to be opposite to the second pixel transistor array.

The second pixel transistor array of the unit pixel block PB3 and the second pixel transistor array of the unit pixel block PB4 may be arranged symmetrical to each other with respect to a boundary line between the unit pixel blocks PB3 and PB4. Thus, whereas the constituent elements of the second pixel transistor array of the unit pixel block PB3 are identical in size to the constituent elements of the second pixel transistor array of the unit pixel block PB4, the arrangement order of the constituent elements of the second pixel transistor array of the unit pixel block PB3 is different from the arrangement order of the constituent elements of the second pixel transistor array of the unit pixel block PB4. The above-mentioned arrangement structure of the second pixel transistor arrays of the unit pixel blocks PB3 and PB4 may be considered a flip-shaped arrangement structure. In this case, the source follower transistor DX32 of the second pixel transistor array of the unit pixel block PB3 may be located adjacent to the source follower transistor DX42 of the second pixel transistor array of the unit pixel block PB4, such that the source follower transistors DX32 and DX42 may share the drive voltage node VDX.

The first pixel transistor array of the unit pixel block PB3 and the first pixel transistor array of the unit pixel block PB4 may be formed in a flip-shaped structure and arranged symmetrical to each other with respect to the boundary line between the unit pixel blocks PB3 and PB4. The source follower transistor DX31 of the first pixel transistor array of the unit pixel block PB3 may be located adjacent to the source follower transistor DX41 of the first pixel transistor array of the unit pixel block PB4, so that the source follower transistors DX31 and DX41 may share the drive voltage node VDX.

Figure 6:
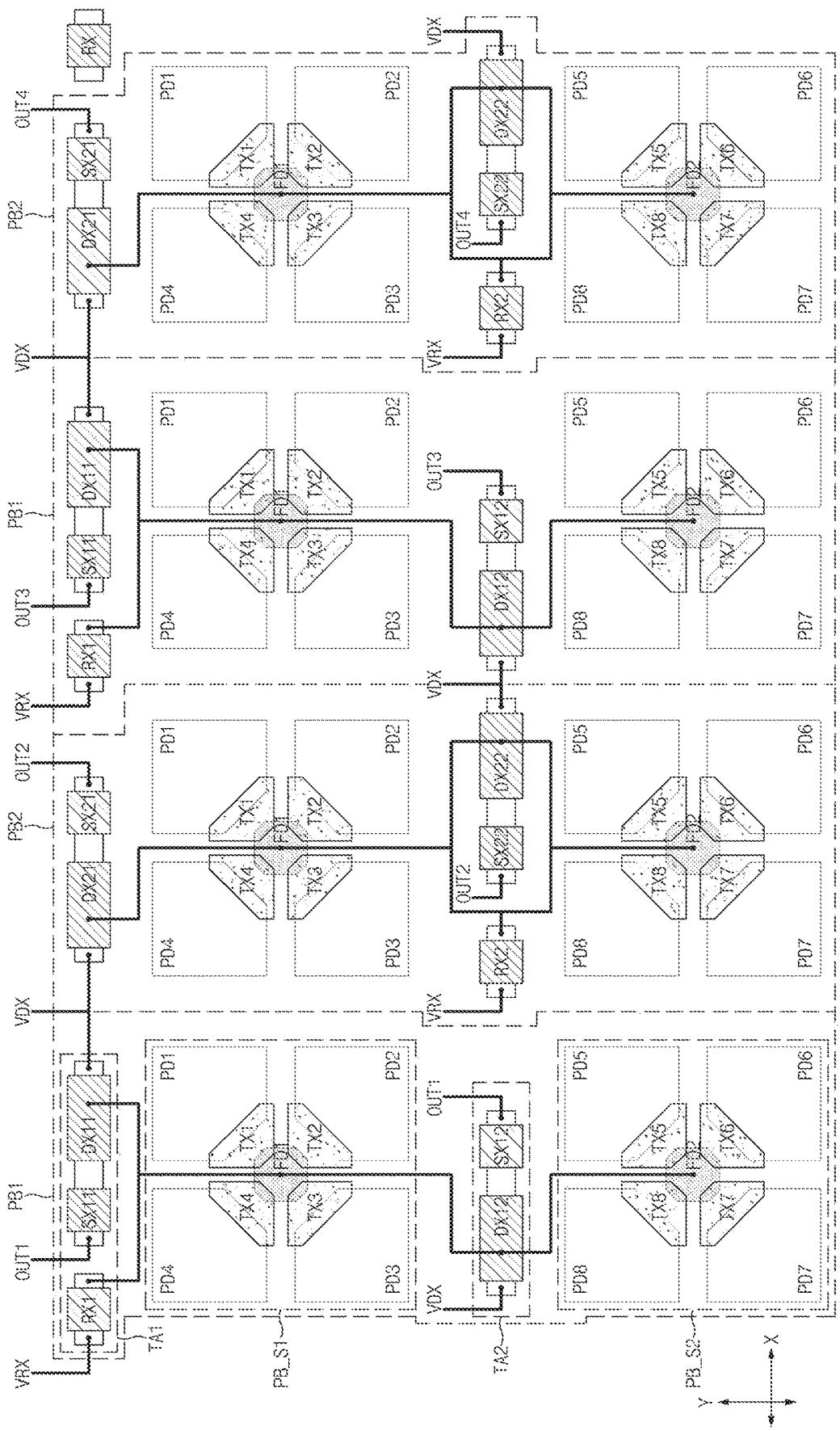
FIG. 6 is another example of a schematic diagram illustrating four unit pixel blocks, each of which includes an 8-shared pixel structure arranged based on some implementations of the disclosed technology.

FIG. 6 is a schematic diagram illustrating four unit pixel blocks, each of which includes an 8-shared pixel structure, arranged based on some implementations of the disclosed technology.

Referring to FIG. 6, the pixel array 100 may include two unit pixel blocks PB1 and PB2 located adjacent to each other in the X-axis direction. Although the unit pixel blocks PB1 and PB2 shown in FIG. 6 are repeatedly arranged in the X-axis direction for convenience of description, other implementations are also possible. In FIG. 6, the pixel array 100 may include a plurality of two unit pixel blocks PB1 and PB2 repeatedly arranged in the X-axis and Y-axis directions. In FIG. 6, two unit pixel blocks PB1 to PB2 will hereinafter be referred to as a unit pixel block group.

Each of the unit pixel blocks PB1 to PB2 may include two floating diffusion (FD) regions FD1 and FD2, two source follower transistors DX11 to DX22), two selection transistors SX11 to SX22, and a single reset transistor RX1 and RX2. Each unit pixel may include a single photoelectric conversion element PD1 to PD8 and a single transmission transistor TX1 to TX8.

Each of the unit pixel blocks PB1 and PB2 shown in FIG. 6 may include two subpixel blocks PB_S1 and PB_S2, each of which allows a single floating diffusion (FD) region to be shared by four unit pixels. Each of the unit pixel blocks PB1 and PB2 may include a first pixel transistor array and a second pixel transistor array that are disposed at both sides of the subpixel block PB_S1, respectively.

In the unit pixel block groups shown in FIG. 6, the first pixel transistor array and the second pixel transistor array may be alternatively arranged along the X-direction. In some implementations, in the unit pixel block groups shown in FIG. 6, the first pixel transistor arrays and the second pixel transistor arrays may be arranged in a zigzag manner. For example, the first pixel transistor array of the unit pixel block PB1 is located at the upper part of the subpixel block PB_S1 of the unit pixel block PB1, the first pixel transistor array of the unit pixel block PB2 is located at the lower part of the subpixel block PB_S1 of the unit pixel block PB2, the first pixel transistor array of the unit pixel block PB1 located adjacent to the unit pixel block PB2 in right side is located at the upper part of the subpixel block PB_S1 of the unit pixel block PB1, and the first pixel transistor array of the unit pixel block PB2 is located at the lower part of the subpixel block PB_S1 of the unit pixel block PB2. Similarly, the second pixel transistor array of the unit pixel block PB1 is located at the lower part of the subpixel block PB_S1 of the unit pixel block PB1, the second pixel transistor array of the unit pixel block PB2 is located at the upper part of the subpixel block PB_S1 of the unit pixel block PB2, the second pixel transistor array of the unit pixel block PB1 located adjacent to the unit pixel block PB2 in right side is located at the lower part of the subpixel block PB_S1 of the unit pixel block PB1, and the second pixel transistor array of the unit pixel block PB2 is located at the upper part of the subpixel block PB_S1 of the unit pixel block PB2. For example, the locations of each of the first pixel transistor array and the second pixel transistor array in each of the unit pixel blocks PB1 and PB2 may be diagonally symmetric about a center of subpixel blocks PB_S1 of the unit pixel blocks PB1 and PB2.

For example, in the unit pixel block PB1, the first pixel transistor array may be disposed at one side, e.g., the upper part, of the subpixel block PB_S1 in the Y-axis direction, and the second pixel transistor array may be disposed at the other side, the lower part of the subpixel block PB_S1 in the Y-axis direction. Thus, the second pixel transistor array may be disposed between the subpixel blocks PB_S1 and PB_S2 so as to be opposite to the first pixel transistor array. In addition, in the unit pixel block PB2, the second pixel transistor array may be disposed at one side, e.g., the upper part, of the subpixel block PB_S1 in the Y-axis direction, and the first pixel transistor array may be disposed at the other side located opposite to the first pixel transistor array.

As described above, the first pixel transistor array and the second pixel transistor array are arranged in a zigzag manner. Thus, around the boundary region between the unit pixel blocks PB1 and PB2, a protrusion part of the first pixel transistor array of the unit pixel block PB2, in which the reset transistor RX2 of the unit pixel block PB2 is located, may be located to be inserted into the recessed part of the second pixel transistor array of the unit pixel block PB1.

In the first pixel transistor array, the reset transistors RX1 and RX2 may be coupled between the reset voltage node VRX and the floating diffusion (FD) regions FD1 and FD2. For example, each of the reset transistors RX1 and RX2 may be formed in a single active region separately from the selection transistor SX11 to SX22 and the source follower transistor DX11 to DX22. In the corresponding active region ACT1, a source/drain region located at one side of a rest gate may be coupled to the reset voltage node VRX, and a source/drain region located at the other side of the rest gate may be coupled to the floating diffusion (FD) regions FD1 and FD2 of the corresponding unit pixel blocks PB1 and PB2.

In the first pixel transistor array and the second pixel transistor array, the selection transistors SX11 and SX22 may be respectively coupled to the source follower transistors DX11 and DX22 in series between the drive voltage node VDX and the output nodes OUT1 to OUT4. For example, the selection transistor and the source follower transistor may be formed to share the source/drain region in a single active region that is formed to extend in the X-axis direction. The source/drain regions of the selection transistors SX11 to SX22, which are located opposite to the shared source/drain regions, may be coupled to the output nodes OUT1 to OUT4. the source/drain regions of the source follower transistors DX11 to DX22, which are located opposite to the shared source/drain regions, may be coupled to the drive voltage node VDX.

In some implementations, each of the unit pixel blocks PB1 and PB2 may include two drive transistor sets and each drive transistor set includes one source follower transistor and one selection transistor that are coupled in series. The two drive transistor sets may be coupled in parallel to each other between the drive voltage node VDX and the output node OUT1 to OUT4.

In two drive transistor sets of each of the unit pixel blocks PB1 and PB2, the source follower transistors and the selection transistors may be arranged differently from each other. For example, in the drive transistor set of the first pixel transistor array of the unit pixel block PB1, the selection transistor SX11 may be located at the left side, e.g., closer to the output node OUT1 than the drive voltage node VDX, and the source follower transistor DX11 may be located at the right side, e.g., closer to the drive voltage node VDX than the output node OUT1. In the drive transistor set of the second pixel transistor array of the unit pixel block PB1, the selection transistor SX12 may be located at the right side, e.g., closer to the output node OUT1 than the drive voltage node VDX, and the source follower transistor may be located at the left side, e.g., closer to the drive voltage node VDX than the output node OUT1. The different arrangements of the selection transistor and the drive transistor in the first pixel transistor array and the second pixel transistor array may be also applied to the unit pixel block PB2.

In this manner, two source follower transistors DX11 and DX12 may be arranged in a diagonal direction (i.e., a first diagonal direction) in the unit pixel block PB1 and two source follower transistors DX21 and DX22 may be arranged in another diagonal direction (i.e., a second diagonal direction) in the unit pixel block PB2. In some implementations, the second diagonal direction crosses the first diagonal direction. In addition, two selection transistors SX11 and SX12 may be arranged in the second diagonal direction in the unit pixel block PB1 and two selection transistors SX21 and SX22 may be arranged in the first diagonal direction in the unit pixel block PB2.

In some implementations, in each of the unit pixel blocks PB1 and PB2, two source follower transistors may be formed to have the same size (e.g., the same channel width), and two selection transistors may also be formed to have the same size (e.g., the same channel width).

As is apparent from the above description, the image sensing device according to the embodiments of the disclosed technology can improve a source follower gain in the 8-shared pixel structure by enlarging the channel widths of the source follower transistor and the selection transistor that are arranged in the unit pixel block.

The image sensing device according to the embodiments of the disclosed technology can increase a transfer rate of one or more pixel signals by reducing resistance of a selection transistor.

Although a number of illustrative embodiments have been described, it should be understood that numerous other modifications and embodiments can be devised by those skilled in the art. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device, comprising:
   a pixel array including unit pixel blocks that are arranged in columns and rows,
   wherein each of the unit pixel blocks includes:
      a first subpixel block including a first floating diffusion (FD) region and unit pixels surrounding the first floating diffusion (FD) region;
      a second subpixel block including a second floating diffusion (FD) region electrically coupled to the first floating diffusion (FD) region and unit pixels surrounding the second floating diffusion (FD) region, the second subpixel block spaced apart from the first subpixel block by a predetermined distance in a first direction; and
      a first pixel transistor array and a second pixel transistor array that are disposed at opposite sides of the first subpixel block in the first direction,
      wherein the first pixel transistor array includes a first drive transistor set in which a first source follower transistor and a first selection transistor are coupled in series, and the second pixel transistor array includes a second drive transistor set in which a second source follower transistor and a second selection transistor are coupled in series,
      wherein the first drive transistor set and the second drive transistor set are coupled in parallel.

2. The image sensing device according to claim 1, wherein the first pixel transistor array further includes:
   a reset transistor located at one side of the first drive transistor set in a second direction perpendicular to the first direction.

3. The image sensing device according to claim 1, wherein the first selection transistor is disposed between the first source follower transistor and the reset transistor in a second direction perpendicular to the first direction.

4. The image sensing device according to claim 1, wherein the first pixel transistor array has a length longer than a length of each of the first subpixel block and the second subpixel block.

5. The image sensing device according to claim 1, wherein one of the first pixel transistor array and the second pixel transistor array is disposed between the first subpixel block and the second subpixel block.

6. The image sensing device according to claim 1, wherein the second subpixel block is disposed on one side of the first subpixel block and the first pixel transistor array is located on the other side of the first subpixel block that is opposite to the second subpixel block.

7. The image sensing device according to claim 1, wherein the first selection transistor and the second selection transistor are located symmetrical to each other in the first direction with respect to the first subpixel block.

8. The image sensing device according to claim 1, wherein the first source follower transistor and the second source follower transistor are located symmetrical to each other in the first direction with respect to the first subpixel block.

9. The image sensing device according to claim 1, wherein the first drive transistor set and the second drive transistor set are arranged along a diagonal direction.

10. The image sensing device according to claim 9, wherein:

the first source follower transistor and the second source follower transistor are arranged along the first diagonal direction, and the first selection transistor and the second selection transistor are arranged along a second diagonal direction crossing the first diagonal direction.

11. The image sensing device according to claim 1, wherein the first floating diffusion (FD) region and the second floating diffusion (FD) region are coupled to a gate of the first source follower transistor and a gate of the second source follower transistor.

12. The image sensing device according to claim 1, wherein the first pixel transistor array has a length longer than that of the second pixel transistor array.

13. An image sensing device comprising:
a pixel array including unit pixel blocks that are arranged in columns and rows,
wherein each of the unit pixel blocks includes:
a first subpixel block configured to include a first floating diffusion (FD) region and unit pixels sharing the first floating diffusion (FD) region;
a second subpixel block configured to include a second floating diffusion (FD) region electrically coupled to the first floating diffusion (FD) region and unit pixels sharing the second floating diffusion (FD) region, the second subpixel block configured to be spaced apart from the first subpixel block by a predetermined distance in a first direction; and
a first pixel transistor array and a second pixel transistor array respectively disposed at both sides of the first subpixel block in the first direction,
wherein the first pixel transistor array includes a first drive transistor set including a first source follower transistor and a first selection transistor; and the second pixel transistor array includes a second drive transistor set including a second source follower transistor and a second selection transistor,
wherein the first drive transistor set and the second drive transistor set are located symmetrical to each other with respect to the first subpixel block.

14. The image sensing device according to claim 13, wherein the first pixel transistor array further includes:
a reset transistor located at one side of the first drive transistor set in a second direction perpendicular to the first direction.

15. The image sensing device according to claim 14, wherein the first selection transistor is disposed between the first source follower transistor and the reset transistor.

16. The image sensing device according to claim 13, wherein:
the first source follower transistor and the second source follower transistor are located symmetrical to each other with respect to the first subpixel block; and
the first selection transistor and the second selection transistor are located symmetrical to each other with respect to the first subpixel block.

* * * * *